United States Patent
Kurusu et al.

(10) Patent No.: US 10,290,518 B2
(45) Date of Patent: May 14, 2019

(54) SUBSTRATE LIQUID PROCESSING APPARATUS

(71) Applicant: TOKYO ELECTRON LIMITED, Minato-ku (JP)

(72) Inventors: Kento Kurusu, Koshi (JP); Yukiyoshi Saito, Koshi (JP); Seiki Ishida, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 243 days.

(21) Appl. No.: 14/834,482

(22) Filed: Aug. 25, 2015

(65) Prior Publication Data

US 2016/0064259 A1    Mar. 3, 2016

(30) Foreign Application Priority Data

Aug. 27, 2014   (JP) ................................ 2014-172241
Mar. 31, 2015   (JP) ................................ 2015-072381

(51) Int. Cl.
*H01L 21/67*   (2006.01)

(52) U.S. Cl.
CPC .. *H01L 21/67051* (2013.01); *H01L 21/67017* (2013.01); *H01L 21/67028* (2013.01)

(58) Field of Classification Search
CPC ..................... H01L 21/67051; H01L 21/67028
See application file for complete search history.

(56) References Cited

U.S. PATENT DOCUMENTS

| 2005/0276921 | A1* | 12/2005 | Miya ......................... B08B 3/02 427/240 |
| 2012/0160278 | A1* | 6/2012 | Higashijima ..... H01L 21/67051 134/33 |
| 2014/0227883 | A1* | 8/2014 | Izumoto .............. H01L 21/6708 438/745 |
| 2014/0290703 | A1* | 10/2014 | Kobayashi ........ H01L 21/67051 134/33 |

FOREIGN PATENT DOCUMENTS

| JP | 11-297652 A | 10/1999 |
| JP | 2001-191006 A | 7/2001 |
| JP | 2003-136024 A | 5/2003 |
| JP | 2004-265911 A | 9/2004 |
| JP | 2005-302746 A | 10/2005 |
| JP | 5005571 | 6/2012 |

* cited by examiner

*Primary Examiner* — Spencer E Bell
(74) *Attorney, Agent, or Firm* — Oblon, McClelland, Maier & Neustadt, L.L.P.

(57) ABSTRACT

A substrate liquid processing apparatus includes a substrate holding device which holds a substrate in horizontal position and rotate the substrate around vertical axis of the substrate, a liquid discharge device which is positioned underneath central portion of lower surface of the substrate in the horizontal position and discharges processing liquid toward the lower surface of the substrate, and a gas discharge passage structure which has a gas discharge passage formed around the discharge device such that drying gas passes through. The discharge device has a head including a cover which is extending beyond upper end of the passage such that the cover is covering the upper end of the passage, a liquid discharge port which is protruding from the cover toward the substrate in the horizontal position, and a curved portion which is formed between the port and cover such that the curved portion has a surface bending downward.

20 Claims, 5 Drawing Sheets

SUBSTRATE LIQUID PROCESSING APPARATUS

CROSS-REFERENCE TO RELATED APPLICATIONS

The present application is based upon and claims the benefit of priority to Japanese Patent Applications No. 2014-172241, filed Aug. 27, 2014, and No. 2015-072381, filed Mar. 31, 2015. The entire contents of these applications are incorporated herein by reference.

BACKGROUND OF THE INVENTION

Field of the Invention

The present invention relates to the technology for supplying a processing liquid to the lower surface of a substrate to conduct liquid treatment on the surface.

Description of Background Art

For example, Japanese Patent Publication No. 5005571 describes a substrate liquid processing apparatus to be used for manufacturing semiconductor devices. The entire contents of this publication are incorporated herein by reference.

SUMMARY OF THE INVENTION

According to one aspect of the present invention, a substrate liquid processing apparatus includes a substrate holding device which holds a substrate in a horizontal position and rotate the substrate around a vertical axis of the substrate, a liquid discharge device which is positioned underneath a central portion of a lower surface of the substrate held in the horizontal position by the substrate holding device and discharges a processing liquid toward the lower surface of the substrate, and a gas discharge passage structure which has a gas discharge passage formed around the liquid discharge device such that a drying gas to be discharged toward the substrate passes through. The liquid discharge device has a head component including a cover portion which is extending beyond an outer side of an upper end of the gas discharge passage such that the cover portion is covering the upper end of the gas discharge passage, a liquid discharge port which is protruding upward from the cover portion toward the substrate in the horizontal position, and a curved portion which is formed between the liquid discharge port and the cover portion such that the curved portion has a surface bending downward.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

First Embodiment

Figure 1:
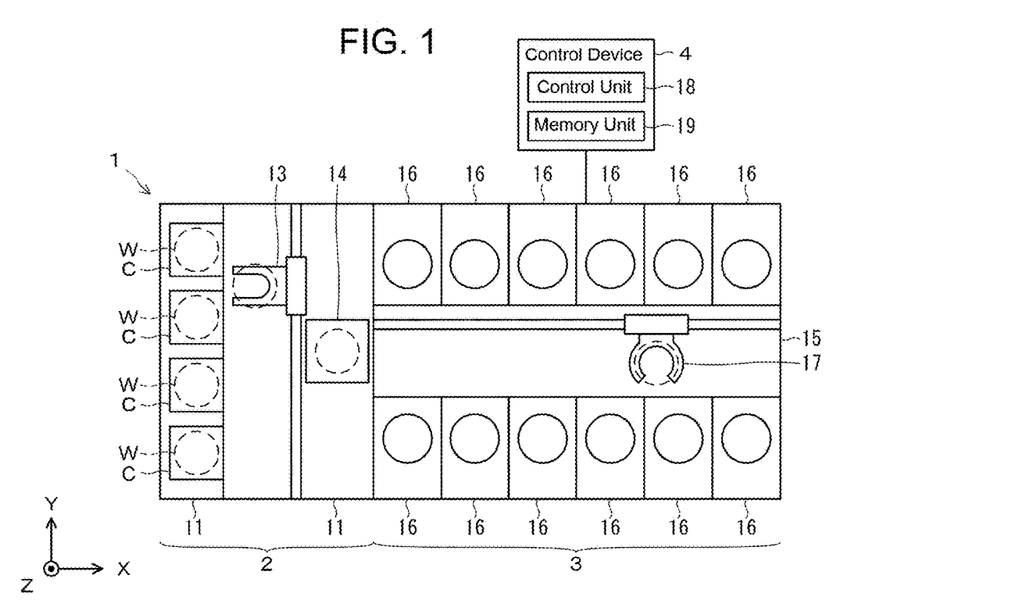
FIG. 1 is a plan view schematically showing the entire structure of a substrate liquid processing apparatus according to an embodiment of the present invention.

FIG. 1 is a view schematically showing the structure of a substrate processing system according to a first embodiment. In the following, X, Y and Z axes intersecting each other at right angles are specified to clarify positional relationships, and a positive direction of the Z axis is set as the vertically upward direction.

As shown in FIG. 1, substrate processing system 1 is provided with loading station 2 and processing station 3. Loading station 2 and processing station 3 are positioned to be adjacent to each other.

Loading station 2 includes carrier mounting zone 11 and transport zone 12. Multiple carriers (C), which accommodate multiple wafers (W) (substrates) horizontally, are mounted in carrier mounting zone 11.

Transport zone 12 is positioned adjacent to carrier mounting zone 11, and is provided with substrate transport device 13 and delivery table 14. Substrate transport device 13 has a substrate holding mechanism for holding a wafer (W). Substrate transport device 13 is capable of moving horizontally and vertically as well as rotating around the vertical axis, and transports a wafer (W) between a carrier (C) and delivery table 14 using the substrate holding mechanism.

Processing station 3 is positioned adjacent to transport zone 12. Processing station 3 includes transport zone 15 and multiple processing units 16. Multiple processing units 16 are aligned on each side of transport zone 15.

Substrate transport device 17 is provided in transport zone 15. Substrate transport device 17 includes a substrate holding mechanism for holding a wafer (W). In addition, substrate transport device 17 is capable of moving horizontally and vertically as well as rotating around the vertical axis, and transports a wafer (W) between delivery table 14 and processing unit 16 using the substrate holding mechanism.

Processing unit 16 conducts predetermined treatments on a wafer (W) transported by substrate transport device 17.

Substrate processing system 1 includes control device 4. Control device 4 is a computer, for example, and includes control unit 18 and memory unit 19. Memory unit 19 stores a program for controlling various treatments carried out in substrate processing system 1. Control unit 18 controls operations to be performed in substrate processing system 1 by reading out and executing the program stored in memory unit 19.

Such a program may be stored in a computer-readable medium and installed from the memory medium onto memory unit 19 of control device 4. Examples of a computer-readable medium are hard disks (HD), flexible disks (FD), compact discs (CD), magneto-optical discs (MO), memory cards and the like.

In substrate processing system 1 structured as above, first, substrate transport device 13 of loading station 2 takes out a wafer (W) from carrier (C) in carrier mounting zone 11, and mounts the wafer (W) on delivery table 14. The wafer (W) mounted on delivery table 14 is unloaded by substrate transport device 17 of processing station 3 to be loaded into processing unit 16.

The wafer (W) loaded into processing unit 16 is treated in processing unit 16 and is unloaded from processing unit 16 by substrate transfer device 17 to be mounted onto delivery table 14. Then, the treated wafer (W) mounted on delivery table 14 is returned by substrate transport device 13 to carrier (C) in carrier mounting zone 11.

Figure 2:
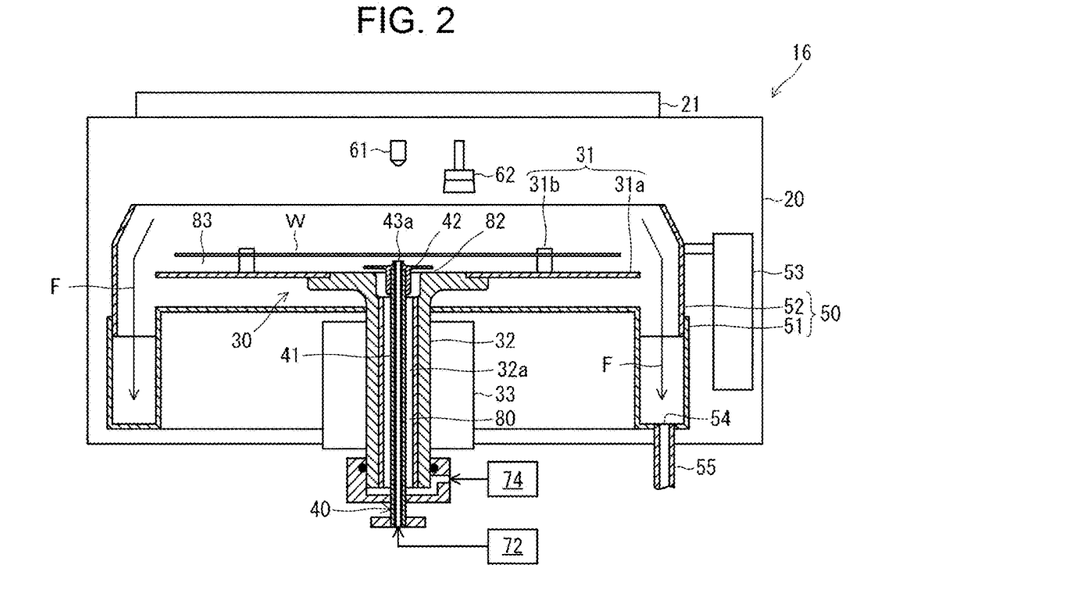
FIG. 2 is a cross-sectional view schematically showing a processing unit included in the substrate liquid processing apparatus shown in FIG. 1.
Figure 3:
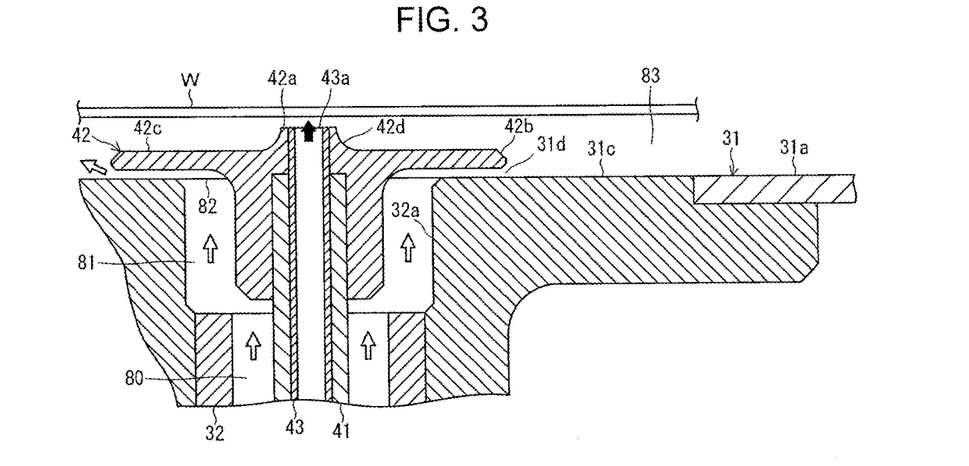
FIG. 3 is an enlarged cross-sectional view showing the vicinity of a processing liquid discharge port and a drying gas discharge port in the processing unit shown in FIG. 2.

The schematic structure of processing unit 16 is described by referring to FIGS. 2 and 3.

As shown in FIG. 2, processing unit 16 includes chamber 20, substrate holding/rotating mechanism 30 that holds and rotates a wafer (W), liquid discharge device 40 that works as a processing liquid supply nozzle, and collection cup 50 that collects the processing liquid used for treating a wafer (W).

Chamber 20 accommodates substrate holding/rotating mechanism 30, liquid discharge device 40 and collection cup 50. FFU (fan filter unit) 21 is installed on the ceiling of chamber 20. FFU 21 generates a downflow in chamber 20. Although not shown here, a later-described CDA (clean dry air) supply port is formed in FFU 21 so that CDA is supplied to a wafer (W) from a CDA supply port (not shown) during drying treatment and the like.

Substrate holding/rotating mechanism 30 is structured as a mechanical chuck for holding a wafer (W) using a mechanical clamping mechanism. Substrate holding/rotating mechanism 30 includes substrate holding device 31, rotation axis 32 and rotation motor (rotation drive device) 33.

Substrate holding device 31 includes circular base plate (plate-like body) (31a), and multiple holding components (31b) provided on the periphery of base plate (31a). Holding components (31b) are formed on the upper portion of base plate (31a) and hold the periphery of a wafer (W). By so setting, space 83 is formed between the lower surface of a wafer (W) and the upper surface of base plate (31a). In an embodiment, some of multiple holding components (31b) are movable, and they advance to or retract from a wafer (W) to switch between holding and releasing the wafer (W), and the rest of holding components (31b) are not movable. Rotation axis 32 is hollow and is formed to extend vertically downward from the central portion of base plate (31a). Rotation motor 33 drives rotation axis 32 so that a wafer (W) held horizontally by substrate holding device 31 rotates around the vertical axis.

Liquid discharge device 40 is formed as a long, narrow rod-shaped component, and the entire structure extends vertically. Liquid discharge device 40 includes head 42 and hollow cylindrical shaft 41 extending vertically. Shaft 41 is inserted into cylindrical cavity (32a) inside rotation axis 32 of substrate holding/rotating mechanism 30. Shaft 41 and rotation axis 32 are set to be concentric. A space is formed between the outer peripheral surface of shaft 41 and the inner peripheral surface of rotation axis 32, and the space, which has an annular cross section, works as gas channel 80.

Liquid discharge device 40 has a cylindrical cavity extending vertically. Processing liquid supply pipe 43 (see FIG. 3) is provided in the cavity. The upper end of processing liquid supply pipe 43 opens at top portion (42a) of head 42 of liquid discharge device 40, and the opened portion works as liquid discharge port (43a) to discharge a processing liquid toward the central portion of the lower surface of a wafer (W) held by substrate holding/rotating mechanism 30 (see the solid black arrow in FIG. 3). Here, top portion (42a) is a ring-shaped planar portion surrounding liquid discharge port (43a) and connecting liquid discharge port (43a) and later-described curved portion (42d).

A predetermined processing liquid to treat the lower surface of a wafer (W) is supplied to processing liquid supply pipe 43 from processing liquid supply mechanism 72. Processing liquid supply mechanism 72 is structured to have a processing liquid supply line connected to a processing liquid supply source, switching valves installed in the processing liquid supply line, a flow monitor and so on; the detailed structure is described later. In the present embodiment, processing liquid supply mechanism 72 is set to supply pure water (DIW); however, the mechanism may also be set to switch the supply of multiple processing liquids, for example, a chemical cleaning solution (such as DHF) and a rinsing solution.

Collection cup 50 is positioned to surround substrate holding device 31 of substrate holding/rotating mechanism 30, and collects the processing liquid scattered from the rotating wafer (W). Collection cup 50 includes immobile lower cup body 51, and upper cup body 52 capable of moving vertically between a raised position (the position shown in FIG. 2) and a lowered position. Upper cup body 52 is raised/lowered by lifting mechanism 53. When upper cup body 52 is at the lowered position, the upper end of upper cup body 52 is positioned lower than a wafer (W) held by substrate holding/rotating mechanism 30. Accordingly, when upper cup body 52 is at the lowered position, a wafer (W) can be transferred between substrate holding/rotating mechanism 30 and the substrate holding mechanism (arm) of substrate transfer device 17 shown in FIG. 1, which entered chamber 20.

Drain port 54 is formed at the bottom of lower cup body 51. The collected processing liquid and the ambient atmosphere in collection cup 50 are drained from collection cup 50 through drain port 54. Drain port 54 is coupled with drainpipe 55, which is connected to the plant exhaust system (not shown), which is under reduced pressure.

The clean air downflow from FFU 21 is suctioned into collection cup 50 through the upper opening of collection cup 50 (upper cup body 52) and is exhausted through drain port 54. Thus, the air flow shown by arrow (F) is generated in collection cup 50.

Processing unit 16 may further include at least one processing liquid supply nozzle 61 to supply a processing liquid (chemical cleaning solution or rinsing solution) onto the upper surface of a wafer (W) held by substrate holding/rotating mechanism 30. Yet furthermore, processing unit 16 may have brush 62 to scrub clean the upper surface of a wafer (W).

The portions related to supplying a liquid and gas to the lower surface of a wafer (W) are described in detail by referring to FIGS. 2 and 3. Unless otherwise specified, each of the components shown in FIG. 3 is categorized under the geometrical term "body of rotation."

The periphery of the upper portion of liquid discharge device 40 (head 42 and its lower area) is encircled by an enveloping component. In the embodiment shown in the drawing, upper portion (32a) of rotation axis 32 corresponds to the enveloping component. There is a ring-shaped space between the upper portion of liquid discharge device 40 and the enveloping component, and the space forms gas discharge passage 81 that passes a drying gas.

In the upper surface of the central portion of base plate (31a), gas discharge port (31d) is formed by peripheral edge (42b) of head 42 of liquid discharge device 40 and surface (31c) of substrate holding device 31. Here, peripheral edge (42b) is the radially outermost portion of head 42. Gas discharge port (31d) is an annular-shaped discharge port to discharge the gas flowing through annular-shaped gas discharge passage 81 to space 83 below a wafer (W) (the space between the wafer (W) and base plate (31a)).

Inert gas as a drying gas, a nitrogen ($N_2$) gas here, is supplied from drying gas supply mechanism 74 to gas channel 80 between axis portion 41 of liquid discharge device 40 and rotation axis 32. Schematically described, drying gas supply mechanism 74 is structured to have a drying gas supply line connected to a drying gas supply source, switching valves installed in the drying gas supply line, a flow monitor and so forth; a detailed structure is described later by referring to the drawings.

The $N_2$ gas supplied from drying gas supply mechanism 74 to gas channel 80 flows into gas discharge passage 81, flows out through upper end 82 of gas discharge passage 81, and is discharged diagonally upward from gas discharge port (31d) (see hollow white arrows in FIG. 3). Namely, when the gas has reached gas discharge port (31d), the discharge direction is set to be diagonally upward because of the curved shape of peripheral edge (42b). As a result, the gas remaining near the central portion of a wafer (W) is drawn outward to be replaced with the incoming gas, thereby facilitating the drying process.

To prevent a liquid (the processing liquid dripping from the lower surface of a wafer (W) after the liquid is discharged from liquid discharge port (43a) and reaches the wafer (W)) from entering gas discharge passage 81 and gas channel 80, peripheral edge (42b) of head 42 (later-described outer edge of cover (42c)) is set to extend radially outward from upper end 82 of gas discharge passage 81 so as to entirely cover upper end 82 of gas discharge passage 81 when seen from above. Meanwhile, since surface (31c) of substrate holding device 31 is set horizontal, a liquid dripped onto the radially outer side of peripheral edge (42b) will not infiltrate into gas discharge passage 81 and gas channel 80. In addition, when a liquid is discharged from liquid discharge port (43a), substrate holding device 31 is rotating. Thus, even if a relatively great amount of liquid is dripped, the liquid is scattered outward due to centrifugal force, and is prevented from infiltrating into gas discharge passage 81 and gas channel 80.

The shape of the upper surface of head 42 is described. As shown in FIG. 3, head 42 is provided with cover (42c) and is in an approximate disc shape when seen from above. To discharge a liquid to a wafer (W) from a position closer to the wafer, liquid discharge port (43a) in the center is set higher than cover (42c). Namely, liquid discharge port (43a) protrudes upward from cover (42c), and top portion (42a) surrounding the discharge port is also set to protrude upward from cover (42c). In the present embodiment, cover (42c) is set as a horizontal plane. However, that is not the only option, and it is sufficient as long as the cover extends radially outward from upper end 82 of gas discharge passage 81 and entirely covers upper end 82. For example, if the cover inclines slightly downward toward the edge, a liquid is more likely to drip down from head 42.

Between top portion (42a) and cover (42c), curved portion (42d) is formed with its surface curved downward. When a liquid is discharged from liquid discharge port (43a), some does not head to a wafer (W) but flows toward top portion (42a) on the side of the discharge port, and some splashes back from a wafer (W) and drips down. Curved portion (42d) collects such liquids and guides them to flow smoothly toward cover (42c).

When, unlike the present embodiment, no curved portion (42d) or top portion (42a) is formed, and when only liquid discharge port (43a) protrudes from cover (42c), the liquid that has dripped onto the vicinity of liquid discharge port (43a) does not flow toward the periphery but tends to stay on the cylindrical outer peripheral surface of liquid discharge port (43a) or on the border with cover (42c), causing a liquid puddle to form. Such a liquid puddle raises the humidity around liquid discharge port (43a) and prevents the central portion of a wafer (W) from drying.

When curved portion (42d) is formed to guide the liquid toward the periphery as in the present embodiment, the formation of the aforementioned liquid puddle is prevented or suppressed, and the central portion of the wafer (W) is dried more efficiently.

When liquid discharge port (43a) is made of a highly hydrophobic material such as PFA, the liquid discharged from liquid discharge port (43a) tends to aggregate at the height of the port and form droplets. Since the space between liquid discharge port (43a) and a wafer (W) has a narrow width, if the size of the droplets grows greater than the width, the droplets may touch the surface of the wafer (W). In the present embodiment, curved portion (42d) is arched with its surface curved downward, and the width of the space between curved portion (42d) and a wafer (W) is wider than the width between liquid discharge port (43a) and the wafer (W). Accordingly, even if the liquid that is flowing down the surface of curved portion (42d) aggregates to form droplets, the droplets will not grow beyond the width of the space, thereby preventing incomplete drying process caused by the droplets in contact with the surface of a wafer (W).

In the present embodiment, cover (42c) is set in advance to be hydrophilic. By so setting, droplets are less likely to be formed, and even when droplets are formed, they are more likely to break down. Accordingly, the liquid guided from curved portion (42d) does not remain on cover (42c) and heads toward the periphery to drip onto surface (31c) of substrate holding device 31. Here, it is an option to set only curved portion (42d) to be hydrophobic so that the liquid guided by cover (42c) will not return to curved portion (42d).

When liquid discharge port (43a) is made of a highly hydrophobic material such as PFA while prevention of droplets is prioritized, it is preferred to perform hydrophilic treatment on curved portion (42d) in addition to cover (42c). Even if a phenomenon such as liquid aggregation occurs near liquid discharge port (43a), the liquid is drawn toward hydrophilic curved portion (42d) and formation of droplets is prevented.

An example of hydrophilic treatment is glass coating on the surface. Another example is forming a sheet of foamed PVA resin (polyvinyl alcohol) and laminating the resin sheet on cover (42c). In such a case, the liquid is absorbed by the sheet, and the liquid on the center area is gradually dried unless the amount is too great, because the center area is under negative pressure. An example of hydrophobic treatment is coating a resin material on the surface.

Next, treatments on a wafer (W) in processing unit 16 are briefly described. Operations performed in each treatment are controlled when control unit 18 reads out and executes the program stored in memory unit 19.

First, when upper cup body 52 is in the lowered position, the substrate holding mechanism (arm) of substrate transfer device 17 enters chamber 20 and transfers a wafer (W) to holding device 31 of substrate holding/rotating mechanism 30. Then, the substrate holding mechanism (arm) retracts from chamber 20, and upper cup body 52 is lifted to the raised position.

Next, substrate holding/rotating mechanism 30 rotates the wafer (W), and a predetermined liquid treatment is performed on the wafer (W). An example of liquid treatment is described below. A chemical cleaning solution (such as DHF) is supplied for a predetermined duration to the upper surface of a wafer (W) (the surface of a wafer (W) where devices are formed) from processing liquid supply nozzle 61. Simultaneously, DIW is supplied to the central portion (substantially the center) in the lower surface of the wafer (W) (the surface without devices) from liquid discharge port (43*a*) of processing liquid supply pipe 43 so that cleaning treatment can be conducted on both the upper and lower surfaces of the wafer (W). Here, simultaneously with the cleaning treatment on the upper surface, it is an option to supply a chemical cleaning solution (such as DHF), instead of DIW, to the central portion of the lower surface of the wafer (W) from liquid discharge port (43*a*) of processing liquid supply pipe 43 so that cleaning treatment using a chemical solution can be conducted on the upper and lower surfaces of the wafer (W).

Next, while the wafer (W) is kept rotating, a rinsing solution (such as pure water (DIW)) is supplied for a predetermined duration to the upper surface of the wafer (W) from processing liquid supply nozzle 61, and a rinsing solution (such as pure water (DIW)) is also supplied simultaneously to the lower central portion of the wafer (W) from liquid discharge port (43*a*) so that rinsing treatment can be conducted on the upper and lower surfaces of the wafer (W). Accordingly, the residual chemical solution and reaction products formed during chemical-solution cleaning are rinsed away from the upper and lower surfaces of the wafer (W).

Next, the liquid supply to the upper and lower surfaces of the wafer (W) is stopped and the upper and lower surfaces of the wafer (W) are dried while the wafer (W) is kept rotating (preferably at a higher rotation speed). During that treatment, a nitrogen gas is discharged from gas discharge port (31*d*) toward the lower surface of the wafer (W) to facilitate the drying process. Since a nitrogen gas has lower humidity, the atmosphere in the space between the lower surface of the wafer (W) and base plate (31*a*) becomes less humid, and the drying process is facilitated.

As described above, liquid hardly ever enters gas discharge port (31*d*). However, to prevent even more securely the infiltration of a liquid into gas discharge port (31*d*), the flow rate at drying gas supply mechanism 74 may be adjusted while a drying treatment is not in process (such as during liquid treatment) so that an inert gas (nitrogen gas) as a purge gas can be discharged from gas discharge port (31*d*) at a flow rate lower than that for a drying treatment.

Then, the rotation of the wafer (W) is stopped, upper cup body 52 is lowered, and the substrate holding mechanism (arm) of substrate transfer device 17 unloads the wafer (W) from holding device 31 of substrate holding/rotating mechanism 30. After the wafer (W) is unloaded and no wafer (W) is held by holding device 31, it is an option to clean head 42 by discharging pure water from liquid discharge port (43*a*) and a nitrogen gas from gas discharge port (31*d*), while discharging pure water using a double-fluid nozzle or the like from above substrate holding device 31.

In the above embodiment, a chemical-solution cleaning is conducted on the upper surface of a wafer (W) using a chemical cleaning solution supplied from processing liquid nozzle 61. However, that is not the only option. For example, scrub cleaning may be conducted using brush 62. While the aforementioned treatment is conducted on the lower surface of a wafer (W), any treatment, or no treatment, may be conducted on the upper surface of the wafer (W).

A substrate to be treated is not limited to semiconductor wafers (wafers (W)); other types such as glass substrates and ceramic substrates may also be treated.

In the present embodiment, cover (42*c*) is set to jut out beyond the upper end 82 of gas discharge passage 81 so as to cover gas discharge passage 81 from above. Such a structure prevents the liquid supplied to the lower surface of a wafer (W) from infiltrating into gas discharge passage 81 while the liquid is discharged to the central portion of the lower surface.

In the present embodiment, curved portion (42*d*) is formed at head 42 so that the liquid discharged from liquid discharge port (43*a*) is guided toward cover (42*c*). Such a structure allows the liquid to be discharged from a position closer to a wafer (W). Thus, effects of cleaning are enhanced, while the dripped liquid is prevented from remaining at head 42 as a liquid puddle. Accordingly, drying efficiency is enhanced. In addition, by forming curved portion (42*d*) in an arch shape with the surface curved downward, droplets are prevented from attaching to the wafer.

In the present embodiment, setting cover (42*c*) to be hydrophilic and curved portion (42*d*) to be hydrophobic is conducted in advance. Accordingly, the liquid is more likely to flow downward from curved portion (42*d*) to cover (42*c*), while the liquid on cover (42*c*) is more likely to drip down onto surface (31*c*) of substrate holding device 31.

Modified Example of First Embodiment

Figure 9A:
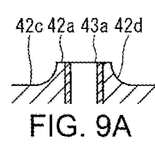
FIGS. 9A-9J show views of modified examples of the first embodiment.
Figure 9B:
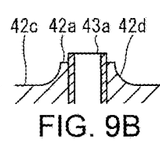
Figure 9C:
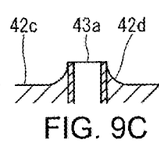
Figure 9D:
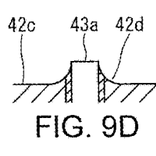
Figure 9E:
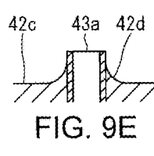

If the liquid discharged from liquid discharge port (43*a*) remains around liquid discharge port (43*a*), the remaining droplets or dust contained in the droplets may attach to the wafer (W). Thus, in the first embodiment, liquid discharge port (43*a*) is set at the same height as top portion (42*a*) of head 42 (upper end of curved portion (42*d*)) as shown in FIG. 9A. However, liquid discharge port (43*a*) may be set higher than (be formed above) top portion (42*a*) (upper end of curved portion (42*d*)), as shown in FIG. 9B. By so setting, liquid discharge port (43*a*) comes even closer to a wafer (W), and cleaning effects are further enhanced. In addition, since the width of top portion (42*a*) is narrow, a processing liquid that has dripped from liquid discharge port (43*a*) does not remain at top portion (42*a*) but flows down to curved portion (42*d*). Thus, drying efficiency will not be affected. Moreover, if hydrophobic treatment is conducted on the outer side surfaces of liquid discharge port (43*a*), the liquid is even more likely to be drawn toward curved portion (42*d*). Such effects are further enhanced if hydrophilic treatment is conducted on curved portion (42*d*). Alternatively, top portion (42*a*) may be omitted as shown in FIG. 9C so that curved portion (42*d*) is directly adjacent to liquid discharge port (43*a*). In such a structure, the tip periphery of processing liquid supply pipe 43 may be shaped in a sharp-edged curve so as to be integrated with curved portion (42*d*) as shown in FIG. 9D. Yet alternatively, liquid discharge port (43*a*) may be set higher than (be formed above) the upper end of curved portion (42d) as shown in FIG. 9E. Here, if the space between a wafer (W) and liquid discharge port (43a) is wide, no droplet will be attached to the wafer (W), and curved portion (42d) can be set in any other shape than that of an arch with its surface curved downward. In such a structure, a guide portion is preferred to be formed between liquid discharge port (43a) and cover (42c) so that the liquid from liquid discharge portion (43a) is guided toward cover (42c). Such a guide portion is not limited to being a curve but may be a straight slope inclining downward.

Figure 9F:
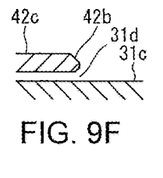
Figure 9G:
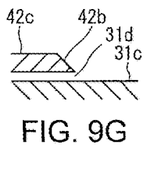
Figure 9H:
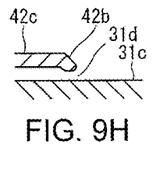
Figure 9I:
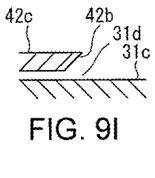
Figure 9J:
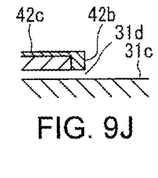

If the liquid discharged from liquid discharge port (43a) remains in gas discharge port (31d), the remaining droplets or dust contained in the droplets may be discharged along with the gas, and may be attached to the wafer (W). Thus, in the first embodiment, the upper portion of peripheral edge (42b) is inclined downward toward the edge while the lower portion of peripheral edge (42b) is inclined upward toward the edge, as shown in FIG. 9F. By so setting, the droplets flowing down the upper surface of cover (42c) will flow smoothly from the peripheral edge (42b) toward outer surface (31c). In addition, droplets are prevented from flowing into gas discharge port (31d) so as not to remain in gas discharge port (31d). The shape of peripheral edge (42b) is not limited to the above example, and the lower portion of peripheral edge (42b) may be set to incline downward to the edge as shown in FIG. 9G. Alternatively, the lower portion of peripheral edge (42b) may be set to jut out while sloping downward as shown in FIG. 9H. Yet alternatively, peripheral edge (42b) may be set to incline sharply downward to the inner side as shown in FIG. 9I. Yet alternatively, the outer surface of cover (42c) may be coated with a hydrophilic and absorbent material such as polyvinyl alcohol as shown in FIG. 9J. In such a structure, the lower portion of peripheral edge (42b) is coated so that moisture is evaporated from the lower surface of peripheral edge (42b) by the gas discharged from gas discharge port (31d).

Second Embodiment

The following describes operations in processing liquid supply mechanism 72 and drying gas supply mechanism 74 during treatments on a wafer (W) conducted in processing unit 16 described in the first embodiment above, along with drain/exhaust operations of the processing liquid and the drying gas.

Figure 4:
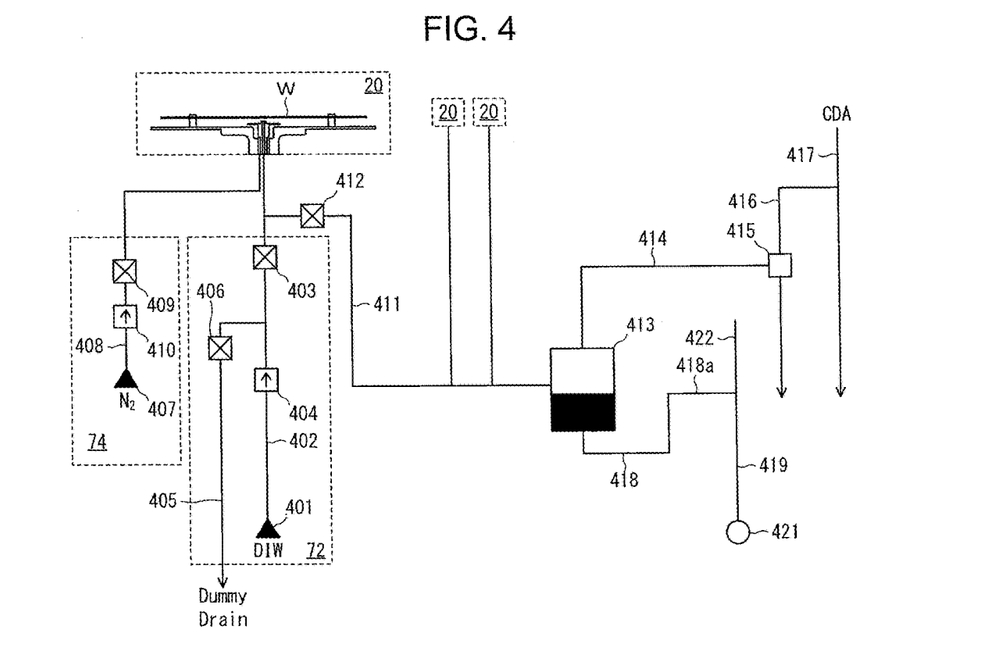
FIG. 4 is a view showing the structure of a liquid supply system in a second embodiment.

FIG. 4 shows the structure of a fluid supply system of the substrate liquid processing apparatus for the supply and removal of a processing liquid and a drying gas in the present embodiment. A chemical solution such as DHF may be used as a processing liquid as described in the first embodiment, but the example described here uses DIW.

In drying gas supply mechanism 74 in FIG. 4, drying gas supply source 407 supplies a gas for drying treatment. A nitrogen ($N_2$) gas is used in the present embodiment. Drying gas supply line 408 is a supply route to feed a drying gas from drying gas supply source 407 to chamber 20. Switching valve 409 is installed in drying gas supply line 408, and controls starting/stopping the supply of a drying gas to chamber 20. Flow monitor 410 is installed in drying gas supply line 408, and monitors the flow rate of a drying gas supplied from drying gas supply line 408 to chamber 20.

In processing liquid supply mechanism 72 in FIG. 4, processing liquid supply source 401 supplies a processing liquid for liquid treatment, and is a supply source of pure water (DIW) as a processing liquid in the present embodiment. Processing liquid supply line 402 is a supply route to feed a processing liquid from processing liquid supply source 401 to chamber 20. Switching valve 403 is installed in processing liquid supply line 402, and controls starting/stopping the supply of a processing liquid to chamber 20. Flow monitor 404 is installed in processing liquid supply line 402 and monitors the flow rate of a processing liquid to be supplied from processing liquid supply source 401 to processing liquid supply line 402. Dummy drain line 405 carries out dummy drainage as described later. Switching valve 406 is installed in dummy drain line 405 and adjusts the amount of liquid that goes into dummy drain line 405.

Drain line 411 is connected to processing liquid supply line 402 between chamber 20 and switching valve 403. Drain line 411 is a branched line to drain the processing liquid remaining in a portion of processing liquid supply line 402 between chamber 20 and switching valve 403 or to exhaust the gas in chamber 20 outside the substrate liquid processing apparatus at the final stage. Switching valve 412 controls starting/stopping drainage of the processing liquid or exhaust of the gas to drain line 411. Drain line 411 is shared by multiple processing units 16 in processing station 3, and the processing liquid and gas used in other chambers 20 structured the same also flow into drain line 411 and are drained.

Trap tank 413 temporarily stores the processing liquid and gas that are removed from each chamber 20 through drain line 411. As described above, the trap tank is also used to prevent a reverse flow of the drained processing liquid back to each chamber 20.

Ejection line 414 is an exhaust route to suction out the gas stored in trap tank 413. Ejection line 414 has a predetermined level of pressure to suction out the gas, and such a suction pressure is obtained from ejector device 415 connected to the end of the line. Ejector device 415 does not use a mechanical drive such as a pump but utilizes a high-speed gas flow to generate a negative pressure close to vacuum. High-speed gas is obtained from CDA branched line 416.

CDA branched line 416 is a passage branched from CDA supply line 417 for supplying CDA (clean dry air) to chamber 20, and passes CDA at a flow rate of 10 L/min, for example. The CDA is exhausted outside the system after passing through ejector device 415.

Tank drain line 418 is connected to the bottom of trap tank 413 and drains the processing liquid to external drain line 419. The pipe to tank drain line 418 goes under trap tank 413, extends upward until it becomes horizontal at the height of uppermost passage (418a), and is connected to external drain line 419. Since tank drain line 418 is structured as above, the level of liquid in trap tank 413 depends on the height of uppermost passage (418a) as described later. External drain line 419 drains the processing liquid through outlet 421 to the outside of the system, and relief portion 422 is installed therein to prevent a reverse flow of the processing liquid.

In the following, descriptions are provided for operations conducted during treatments on a wafer (W) in processing unit 16 in the fluid supply system having the above structure. Operations performed for each procedure in the system are controlled when control unit 18 reads out and executes the program stored in memory unit 19.

In the drawings referred to as described below, a bold black line along a pipe indicates a processing liquid is passing through the pipe. Arrows along pipes indicate a processing liquid (in solid black arrows) or a gas (in hollow white arrows) is flowing in the direction of the arrow. Also, since the same treatments and operations are conducted in other chambers 20, their descriptions are omitted here.

Figure 5:
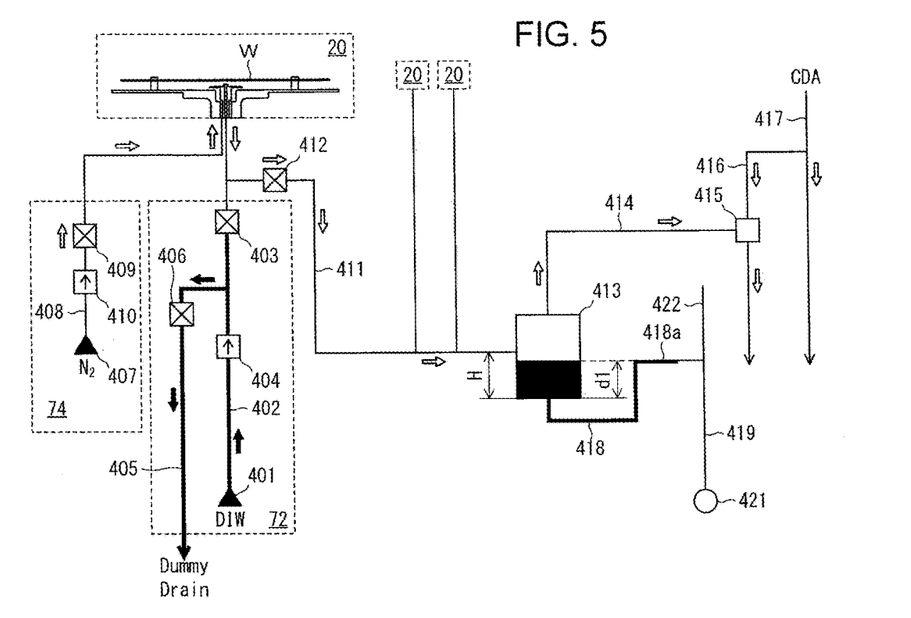
FIG. 5 is a view showing a state of the liquid supply system during a standby mode prior to starting a liquid treatment operation.

FIG. 5 shows the state of the fluid supply system in a standby mode prior to starting liquid treatment on a wafer. During a standby mode, control unit 18 controls switching valve 403 to close, switching valve 412 to open, switching valve 409 to open, and switching valve 406 to open/close repeatedly at predetermined time intervals.

By controlling as described above, a dummy drain operation is carried out in the standby mode. Namely, a processing liquid from processing liquid supply source 401 passes through processing liquid supply line 402 toward dummy drain line 405 without being supplied to chamber 20. Switching valve 406 repeats opening/closing in dummy drain line 405 to roughly control the amount of flowing liquid so that the processing liquid is drained. It is an option to use flow monitor 404 for an accurate control of the flow rate. By conducting a dummy drain operation, the processing liquid remaining in processing liquid supply line 402 is drained before starting another liquid treatment, and a fresh liquid that is not degraded is supplied at the start of liquid treatment on a wafer (W).

While carrying out a dummy drain operation, a drying gas is supplied through drying gas supply line 408 onto the lower surface of a wafer (W) from gas discharge port (31d). The supply rate at that time is adjusted by flow monitor 410 at a lower rate than that for the later-described drying process. In the present embodiment, since switching valve 403 is closed, the processing liquid is not present in the portion above the valve. The gas after it is supplied to chamber 20 is exhausted through liquid discharge port (43a). The exhaust gas reaches trap tank 413 after passing through drain line 411.

The liquid level (d1) in trap tank 413 is lower than height (H) at the flow inlet of the tank. When the processing liquid does not flow in or its flow amount is small, liquid level (d1) depends on the height of uppermost passage (418a) of tank drain line 418. Namely, when the liquid level is higher than level (d1), the processing liquid stored in trap tank 413 pushes down the processing liquid in tank drain line 418 using the pressure derived from its own weight so that the processing liquid flows out from uppermost passage (418a) to external drain line 419. On the other hand, when the level in trap tank 413 reaches level (d1), which is the same as in uppermost passage (418a), the pressure is balanced with that of the processing liquid in tank drain line 418. Thus, the forefront of the processing liquid stops moving approximately in the middle point of uppermost passage (418a) and the liquid level will remain the same.

As described above, the processing liquid stored in trap tank 413 has a lower liquid level than height (H) of the inlet of trap tank 413. The exhaust gas passes easily through drain line 411 and reaches trap tank 413. Then, the gas passes through the space in the tank and heads toward ejection line 414. The gas passing through ejection line 414 reaches ejector device 415, merges with the gas flowing through CDA branched line 416, and is finally exhausted out of the system.

As described above, ejector device 415 draws the gas out of ejection line 414 at a predetermined suction pressure, and such suctioning has an impact all the way to gas discharge port (31d) through the space in trap tank 413 and drain line 411. Thus, the suction pressure at gas discharge port (31d) can be set higher than that by using natural exhaust. Accordingly, even when chamber 20 is in a standby mode, the degree of purity is higher in the space under the lower surface of a wafer (W) than when natural exhaust is conducted.

Figure 6:
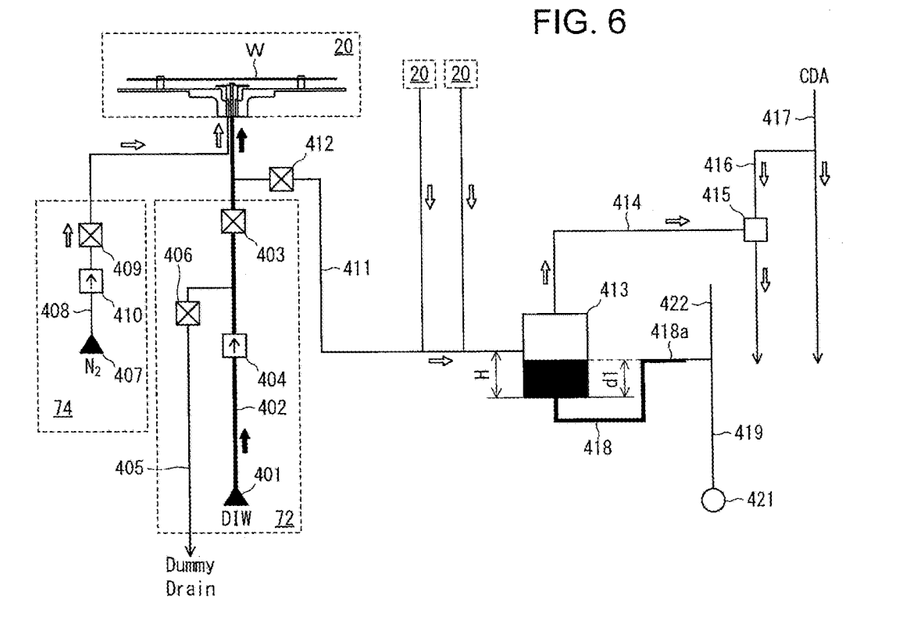
FIG. 6 is a view showing a state of the liquid supply system during a liquid treatment operation.

FIG. 6 shows the state of the fluid supply system during liquid treatment on a wafer. During liquid treatment, control unit 18 controls switching valve 403 to open, switching valve 412 to close, switching valve 409 to open, and switching valve 406 to close.

By so setting, a processing liquid is discharged from liquid discharge port (43a) during liquid treatment, and cleaning is carried out on the lower surface using a processing liquid (DIW) as described in the first embodiment. At that time, a purge operation is also carried out by discharging a drying gas from gas discharge port (31d).

During liquid treatment, the processing liquid and drying gas do not flow into drain line 411 because switching valve 412 is closed. However, since drain line 411 is also connected to other chambers 20, drain line 411 is capable of exhausting the gas from chambers 20 in a standby mode through trap tank 413, ejection line 414, ejector device 415 and CDA branched line 416, the same as in the aforementioned operation during a standby mode.

Figure 7:
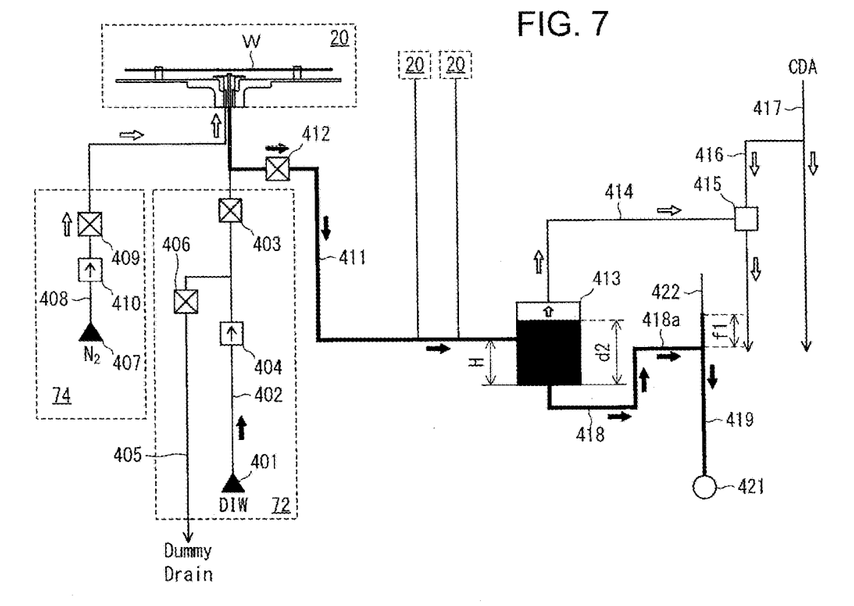
FIG. 7 is a view showing a state of the liquid supply system during a drying treatment operation.

FIG. 7 shows the state of the fluid supply system during drying treatment. Control unit 18 controls switching valve 403 to close, switching valve 412 to open, switching valve 409 to open, and switching valve 406 to close while drying treatment is conducted.

According to the control above, a drying gas is discharged from gas discharge port (31d) during drying treatment so that the lower surface of a wafer is dried using a drying gas ($N_2$) as described in the first embodiment.

During drying treatment, switching valve 412 is set open so that the processing liquid that did not reach chamber 20 but remained in processing liquid supply line 402 flows into drain line 411.

The processing liquid that flowed into trap tank 413 is stored temporarily in trap tank 413, then flows into tank drain line 418, passes uppermost passage (418a) and finally flows out toward external drain line 419. At that time, when the inflow amount from drain line 411 to trap tank 413 is greater than the outflow amount from tank drain line 418 to external drain line 419, the liquid level in trap tank 413 is elevated and reaches height (H) at the tank liquid inlet.

When the liquid level of trap tank 413 is higher than height (H) at the inlet, the processing liquid in trap tank 413 may reverse its flow toward the upstream side of drain line 411, or the flow from drain line 411 may stop moving even if the flow is not reversed. However, ejector device 415 draws out the gas in trap tank 413 at a predetermined suction pressure through ejection line 414 in the present embodiment. Thus, the liquid level in trap tank 413 can be elevated beyond height (H) at the inlet, and reverse flow or the like in drain line 411 is prevented.

Meanwhile, the processing liquid that flowed into tank drain line 418 is drained through external drain line 419. When the inflow amount from tank drain line 418 exceeds the drainage capacity of external drain line 419, a reverse flow toward the upstream side may occur in tank drain line 418. In the present embodiment, relief portion 422 is set along external drain line 419 so that a predetermined amount of processing liquid can be temporarily stored therein (the portion (f1) in FIG. 7). Thus, even when a large amount of processing liquid flows into external drain line 419, the excess amount is adjusted by relief portion 422 and a reverse flow is prevented. Accordingly, the processing liquid is smoothly drained.

Figure 8:
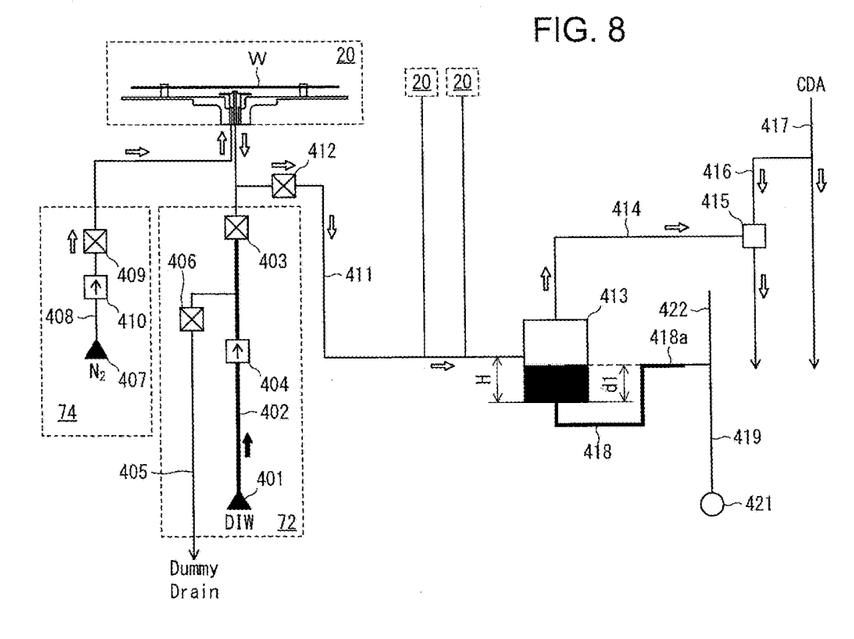
FIG. 8 is a view showing a state of the liquid supply system when the discharge operation of a processing liquid is completed.

FIG. 8 shows the state of the fluid supply system when the drain operation of the processing liquid is completed. Except that a dummy drain is not in operation, the state is the same as in a standby mode, as shown in FIG. 5. After the drain operation, the flow rate of a drying gas may be increased by flow monitor 410 so as to facilitate the drying process.

According to the present embodiment, when the processing liquid remaining in processing liquid supply line 402 is drained through drain line 411 during drying treatment in chamber 20, the liquid level in trap tank 413 is elevated by suctioning out the gas in trap tank 413 through ejection line 414. Accordingly, since more processing liquid can be stored in trap tank 413 and a reverse flow to drain line 411 is prevented, the processing liquid is drained smoothly. In addition, relief portion 422 is provided along external drain line 419 to temporarily store the draining liquid from tank drain line 418. As a result, the difference in the amount flowing from tank drain line 418 and the drainage capacity of external drain line 419 is alleviated, and a reverse flow to trap tank 413 is thereby prevented.

The present invention is not limited to the aforementioned structures. For example, ejector device 415 is structured to be driven by a gas supplied from CDA branched line 416 in the above embodiments. However, ejector device 415 may be driven by a gas from a branched line of other gas supply lines such as the $N_2$ supply line instead of a CDA supply line. Also, the remaining processing liquid is drained during the drying process, but that is not the only option. The liquid may also be drained during other processing modes such as a standby mode.

When semiconductor devices are manufactured, a substrate such as a semiconductor wafer may be held horizontally and rotated around the vertical axis so that a cleaning solution (a chemical cleaning solution or rinsing solution, for example) is supplied to the lower surface of the substrate (substrate surface without devices) to conduct cleaning treatment on the lower surface. Such liquid treatment may be carried out at the same time as a cleaning process on the upper surface of the substrate (substrate surface with devices). After the lower surface is cleaned, the substrate is rotated at high speed to shake off the liquid so that the substrate is dried. During that time, to facilitate the drying process and to prevent water marks, an inert gas such as a nitrogen gas is supplied to the lower side of the substrate.

In an apparatus to conduct the above treatments, the cleaning liquid and inert gas may be both supplied to the central portion of the lower surface of a substrate. Thus, the liquid discharge port and inert gas discharge port may be both positioned underneath the central portion of the lower surface of the substrate. Accordingly, some of the cleaning solution that has reached the lower surface of the substrate may drip down toward the inert gas discharge port and infiltrate into the discharge port, resulting in contamination of the discharge port.

A substrate liquid processing apparatus according to an embodiment of the present invention is capable of enhancing the efficiency of drying the lower surface of a substrate while preventing the liquid supplied to the substrate lower surface from infiltrating into the discharge port of a drying gas.

A substrate liquid processing apparatus according to an embodiment of the present invention is structured to have a substrate holding device, which holds a substrate horizontally and rotates the substrate around the vertical axis; a liquid discharge device, which is positioned below the central portion of the lower surface of the substrate held by the substrate holding device and discharges a processing liquid toward the lower surface of the substrate; and a gas discharge passage, which is formed around the liquid discharge device and passes a drying gas to be discharged toward the substrate. In such a liquid processing apparatus, the liquid discharge device has a head that includes a cover extending to the outer side of the upper end of the gas discharge passage so as to cover the gas discharge passage from above; a liquid discharge port protruding upward from the cover; and a curved portion formed between the liquid discharge port and the cover to have a shape with a surface curved downward.

According to the substrate liquid processing apparatus of an embodiment of the present invention, the liquid supplied to the lower surface of a substrate is prevented from infiltrating into the discharge port of a drying gas. Moreover, the liquid is suppressed from remaining near the supply area so that the efficiency of drying the entire lower surface of the substrate is enhanced.

Obviously, numerous modifications and variations of the present invention are possible in light of the above teachings. It is therefore to be understood that within the scope of the appended claims, the invention may be practiced otherwise than as specifically described here.

What is claimed is:

1. A substrate liquid processing apparatus, comprising:
a substrate holding device configured to hold a substrate in a horizontal position and rotate the substrate around a vertical axis of the substrate;
a liquid discharge device positioned underneath a central portion of a lower surface of the substrate held in the horizontal position by the substrate holding device and configured to discharge a processing liquid toward the lower surface of the substrate; and
a gas discharge passage structure comprising a gas discharge passage which is formed around the liquid discharge device and is configured such that a drying gas to be discharged toward the substrate passes through,
wherein the liquid discharge device includes a processing liquid supply pipe and a head component such that the head component has a cover portion which extends beyond an outer side of an upper end of the gas discharge passage and which covers the upper end of the gas discharge passage, that the processing liquid supply pipe has a liquid discharge port which protrudes upward from the cover portion toward the substrate in the horizontal position, and that the head component has a curved portion which is formed between the liquid discharge port and the cover portion and which has a surface bending downward, and a top portion which has a ring-shaped planar portion surrounding the liquid discharge port and connecting the liquid discharge port and the curved portion, and the liquid discharge device is formed such that the liquid discharge port of the processing liquid supply pipe has a hydrophobic external side surface and that the cover portion of the head component has a hydrophilic surface.

2. The substrate liquid processing apparatus according to claim 1, wherein the surface of the curved portion is a hydrophilic surface.

3. The substrate liquid processing apparatus according to claim 2, wherein the head component of the liquid discharge device has the top portion connecting the liquid discharge port and the curved portion such that the top portion and the liquid discharge port have a same height.

4. The substrate liquid processing apparatus according to claim 2, wherein the head component of the liquid discharge device is formed such that the liquid discharge port of the processing liquid supply pipe is positioned higher than the top portion having the ring-shaped planar portion and that the ring-shaped planar portion and the liquid discharge port of the processing liquid supply pipe form a step structure.

5. The substrate liquid processing apparatus according to claim 2, further comprising:
an enveloping component encircling the liquid discharge device,
wherein the gas discharge passage of the gas discharge passage structure comprises a gap formed between the liquid discharge device and the enveloping component.

6. The substrate liquid processing apparatus according to claim 1, wherein the surface of the curved portion is a hydrophobic surface.

7. The substrate liquid processing apparatus according to claim 6, wherein the head component of the liquid discharge device is formed such that the liquid discharge port of the processing liquid supply pipe is positioned higher than the top portion having the ring-shaped planar portion and that the ring-shaped planar portion and the liquid discharge port of the processing liquid supply pipe form a step structure.

8. The substrate liquid processing apparatus according to claim 1, wherein the head component of the liquid discharge device has the top portion connecting the liquid discharge port and the curved portion such that the top portion and the liquid discharge port have a same height.

9. The substrate liquid processing apparatus according to claim 1, wherein the head component of the liquid discharge device is formed such that the liquid discharge port of the processing liquid supply pipe is positioned higher than the top portion having the ring-shaped planar portion and that the ring-shaped planar portion and the liquid discharge port of the processing liquid supply pipe form a step structure.

10. The substrate liquid processing apparatus according to claim 1, further comprising:
an enveloping component encircling the liquid discharge device,
wherein the gas discharge passage of the gas discharge passage structure comprises a gap formed between the liquid discharge device and the enveloping component.

11. The substrate liquid processing apparatus according to claim 1, wherein the head component of the liquid discharge device and the substrate holding device are configured such that a peripheral edge of the head component and a surface of the substrate holding device form a gas discharge port configured to discharge the drying gas.

12. The substrate liquid processing apparatus according to claim 1, further comprising:
a processing liquid supply line which is connected to the processing liquid supply pipe and supplies a processing liquid to be discharged from the liquid discharge device;
a drain line which is connected to the processing liquid supply line and discharges at least one of the drying gas supplied to the substrate and the processing liquid remaining in the processing liquid supply line;
a trap tank which temporarily stores at least one of the processing liquid and the drying gas discharged from the drain line;
an ejection line which is connected to the trap tank and exhaust the drying gas in the trap tank; and
an ejector device connected to the ejection line and configured to suction the drying gas in the trap tank through the ejection line such that a liquid level in the trap tank is elevated when the processing liquid remaining in the processing liquid supply line is discharged.

13. The substrate liquid processing apparatus according to claim 12, further comprising:

a tank drain line which is connected to the trap tank and drains the processing liquid stored in the trap tank; and
an external drain line which is connected to the tank drain line and drains the processing liquid from the tank drain line to outside,
wherein the external drain line includes a relief portion configured to temporarily store the processing liquid from the tank drain line such that a difference in flow amounts in the tank drain line and the external drain line is alleviated.

14. A substrate liquid processing apparatus, comprising:
a substrate holding device configured to hold a substrate in a horizontal position and rotate the substrate around a vertical axis of the substrate;
a liquid discharge device positioned underneath a central portion of a lower surface of the substrate held in the horizontal position by the substrate holding device and configured to discharge a processing liquid toward the lower surface of the substrate; and
a gas discharge passage structure comprising a gas discharge passage which is formed around the liquid discharge device and is configured such that a drying gas to be discharged toward the substrate passes through,
wherein the liquid discharge device includes a processing liquid supply pipe and a head component such that the head component has a cover portion which extends beyond an outer side of an upper end of the gas discharge passage and which covers the upper end of the gas discharge passage, that the processing liquid supply pipe has a liquid discharge port which protrudes upward from the cover portion toward the substrate in the horizontal position, and that the head component has a curved portion which is formed between the liquid discharge port and the cover portion and which has a surface bending downward, and a top portion which has a ring-shaped planar portion surrounding the liquid discharge port and connecting the liquid discharge port and the curved portion, and the liquid discharge device is formed such that the liquid discharge port of the processing liquid supply pipe has a hydrophobic external side surface and is positioned higher than the top portion having the ring-shaped planar portion and that the ring-shaped planar portion and the liquid discharge port of the processing liquid supply pipe form a step structure.

15. The substrate liquid processing apparatus according to claim 14, wherein the surface of the curved portion is a hydrophilic surface.

16. The substrate liquid processing apparatus according to claim 14, further comprising:
an enveloping component encircling the liquid discharge device,
wherein the gas discharge passage of the gas discharge passage structure comprises a gap formed between the liquid discharge device and the enveloping component.

17. The substrate liquid processing apparatus according to claim 14, wherein the head component of the liquid discharge device and the substrate holding device are configured such that a peripheral edge of the head component and a surface of the substrate holding device form a gas discharge port configured to discharge the drying gas.

18. The substrate liquid processing apparatus according to claim 14, further comprising:

a processing liquid supply line which is connected to the processing liquid supply pipe and supplies a processing liquid to be discharged from the liquid discharge device;

a drain line which is connected to the processing liquid supply line and discharges at least one of the drying gas supplied to the substrate and the processing liquid remaining in the processing liquid supply line;

a trap tank which temporarily stores at least one of the processing liquid and the drying gas discharged from the drain line;

an ejection line which is connected to the trap tank and exhaust the drying gas in the trap tank; and an ejector device connected to the ejection line and configured to suction the drying gas in the trap tank through the ejection line such that a liquid level in the trap tank is elevated when the processing liquid remaining in the processing liquid supply line is discharged.

19. The substrate liquid processing apparatus according to claim 18, further comprising:

a tank drain line which is connected to the trap tank and drains the processing liquid stored in the trap tank; and an external drain line which is connected to the tank drain line and drains the processing liquid from the tank drain line to outside, wherein the external drain line includes a relief portion configured to temporarily store the processing liquid from the tank drain line such that a difference in flow amounts in the tank drain line and the external drain line is alleviated.

20. The substrate liquid processing apparatus according to claim 14, wherein the surface of the curved portion is a hydrophobic surface.

* * * * *